US006804096B2

United States Patent
Nagata

(10) Patent No.: US 6,804,096 B2
(45) Date of Patent: Oct. 12, 2004

(54) LOAD DRIVING CIRCUIT CAPABLE OF RAISED ACCURACY DETECTION OF DISCONNECTION AND SHORT CIRCUIT OF THE LOAD

(75) Inventor: Junichi Nagata, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/207,331

(22) Filed: Jul. 29, 2002

(65) Prior Publication Data

US 2003/0021073 A1 Jan. 30, 2003

(30) Foreign Application Priority Data

Jul. 27, 2001 (JP) ........................................ 2001-227656

(51) Int. Cl.[7] .............................. H02H 3/20; H02H 9/04
(52) U.S. Cl. ........................................ 361/78; 361/91.2
(58) Field of Search ........................ 361/78, 91.2, 91.1, 361/160

(56) References Cited

U.S. PATENT DOCUMENTS

| | | | | |
|---|---|---|---|---|
| 4,929,884 A | * | 5/1990 | Bird et al. ................... | 323/313 |
| 5,010,439 A | * | 4/1991 | Zisa et al. ..................... | 361/91 |
| 5,017,816 A | * | 5/1991 | Wilcox ......................... | 307/570 |
| 5,313,923 A | * | 5/1994 | Takeuchi et al. ............ | 123/497 |
| 5,410,190 A | * | 4/1995 | Carobolante ................. | 327/110 |
| 5,550,497 A | * | 8/1996 | Carobolante ................. | 327/110 |
| 5,687,065 A | * | 11/1997 | Majid ........................... | 363/89 |
| 5,796,278 A | * | 8/1998 | Bruce et al. ................. | 327/108 |
| 6,133,768 A | * | 10/2000 | Price et al. .................. | 327/110 |

FOREIGN PATENT DOCUMENTS

| | | |
|---|---|---|
| JP | 64-62015 | 3/1989 |
| JP | 2-75222 | 3/1990 |
| JP | 2-113622 | 4/1990 |
| JP | 3-172017 | 7/1991 |
| JP | 7-70981 | 7/1995 |
| JP | 2870558 | 1/1999 |
| JP | 2941400 | 6/1999 |
| JP | 2002-9602 | 1/2002 |

OTHER PUBLICATIONS

A. Sedra, K. Smith, Microelectronic Circuits, 1987, Holt, Rinehart and Winston, pp. 342–345, 408–410.*
U.S. Publication No. 2002/0021150 A1 (corres. to 2002–9602).
U.S.S.N. 10/050,745 filed Jan. 16, 2002 to Nagata, J.

* cited by examiner

Primary Examiner—Gregory J. Toatley, Jr.
Assistant Examiner—Z Kitov
(74) Attorney, Agent, or Firm—Harness, Dickey & Pierce, PLC

(57) ABSTRACT

A load driving circuit controls a feed of a power supply voltage of a power supply to a load. A power MOSFET is connected in series with the power supply and the load. A load driving state such as disconnection and short circuit of the load is detected by comparing a predetermined reference voltage and a voltage of the load and MOSFET node. For this, a pull-up resistor is connected between the power supply and the load. A diode is connected between source and gate of the MOSFET. A transistor circuit is connected between source and gate of the MOSFET to discharge a gate capacitance of the MOSFET. In a non-feed mode, a driving current is made to flow in a control electrode of the transistor circuit. The magnitude of the driving current is preferably enough to operate the transistor circuit and the voltage drop caused by the driving current is preferably smaller than a difference between the power supply voltage and the predetermined reference voltage.

7 Claims, 5 Drawing Sheets

LOAD DRIVING CIRCUIT CAPABLE OF RAISED ACCURACY DETECTION OF DISCONNECTION AND SHORT CIRCUIT OF THE LOAD

BACKGROUND OF THE INVENTION

1. Field of the Invention

The invention relates to an electronic circuit (hereinafter, referred to as "load driving circuit") for controlling the power feed to the load which circuit has a function of detecting an abnormal state such as the disconnection and the short circuit of the load.

2. Description of the Related Art

FIG. 1 is a schematic diagram for conceptually describing the structure of a conventional load driving circuit in a high side driver configuration which circuit is used in the electronic control unit (ECU) mounted in a vehicle and has a load disconnection and/or short circuit detection function. The circuit of FIG. 1 comprises a battery 1 having its negative electrode connected to ground; a load driving circuit IC (integrated circuit) 100 having its positive power terminal or pin 101 connected to the positive electrode of the battery 1 and its negative power or ground pin 103 connected to ground; a load 2 connected between an output terminal 102 of IC 100 and the ground; and a pull-up resistor 3 connected between positive power pin 101 and output pin 102 of IC 100 for pulling up the IC output pin 102.

In the load driving circuit IC 100, between its positive power 101 and output 102 pins, there are connected the drain and source of an N-channel power MOSFET 111 and the cathode and anode of a protection diode 112, respectively. Between the gate and the source of FET 111 there is connected a diode 117 to prevent the reverse biasing of the FET 111 gate. The IC 100 further comprises a charge pump 109 having its input voltage supplied from the positive electrode of battery 1 through a dedicated pin 104 of IC 100 to provide a charge voltage Vc; a switch circuit 110 connected between the output of charge pump 109 and the gate of FET 111 to effect connection and disconnection between them; a buffer 108 having its input connected to a power feed control signal input pin 105 to receive a binary power feed control signal Sa from a not-shown external controller and its output connected to a control terminal of switch circuit 110 so as to control the switching operation thereof; an inverter 114 having its input connected to the buffer 108 output to provide an inverted version $\overline{Sa}$ of signal Sa; a discharging NPN transistor 14 having its gate connected to the inverter 114 output and its emitter connected to the ground pin 103; a resistor 116 connected between the collector of discharging transistor 14 and the node including the gate of power FET 111; and a comparator 113 having its non-inverting input connected to the power output pin 102, its inverting input supplied with a reference voltage Vr and its output Sc connected to a comparator output pin 106 which is connected to the above-mentioned not-shown controller.

In thus structured load driving circuit, if the power feed control signal Sa is at the high level that indicates that the battery voltage Vb should be supplied to the load 2, then the switch 110 is on (i.e., conductive) and the transistor 115 is off (i.e., nonconductive), holding the power FET 111 on, which means that the load 2 is electrically connected to the battery 1 through the FET 111. If the power feed control signal Sa is at the low level that indicates that the battery voltage Vb should not be supplied to the load 2, then the switch 110 is off and the transistor 115 is on, holding the power FET 111 off, which means that the load 2 is not connected to the battery 1. For this purpose, the charge pump circuit 109 is so arranged as to use the battery voltage Vb supplied through an IC pin 104 and generate a raised voltage Vc higher than the battery voltage Vb by more than the threshold voltage Vt of the power FET 111: i.e., Vc>Vb+Vt.

Since the load driver IC 100 is provided with the comparator 113 and has the external pull-up resistor 3, the IC 100 can detect abnormalities such as a disconnection and a short circuit of the load 2. Though a short circuit can be always detected by monitoring the level of the comparator 113 output or the IC pin 106, the abnormality detection is preferably performed while the power FET 111 is off. If the FET 111 is off for example, then the current from the battery 1 flows mainly through either of the following two current paths in response to the connection condition of the load 2. That is, the current flows through:

in case of disconnection of the load 2,
   the first path comprising the battery 1 positive electrode, the pull-up resistor 3, the power output pin 102, the diode 117, the resistor 116, the discharging transistor 115, the ground pin 103 and the battery 1 negative electrode; and in cases other than disconnection of the load 2,
   the second path comprising the battery 1 positive electrode, the pull-up resistor 3, the load 2 and the battery 1 negative electrode.

If the load 2 is normally connected, then the FET 111 being off causes the current to flow through the second path. In this case, The level of the power output pin 102, i.e., Vo, is given by Vb·R2/(R2+R3). Here, R2 and R3 are the resistor values of the load 2 and the pull-up resistor 3, respectively. (Hereinafter, we make it a rule to express the resistance value of an element denoted by a reference numeral "N" with a form of "RN".) Since the resistance R3 of the resistor 3 is usually set to a sufficiently large value as compared with the resistance value R2 of the load 2, the output pin 102 level is close to 0V. If a disconnection exists in the load 2 when the load is viewed from its both ends, then the FET 111 being off causes the current to flow through the first path, resulting in the level Vo of the IC pin 102 being equal to the voltage drop due to diode 117, resistor 116 and transistor 115. The voltage drop is roughly given by Vb·R116/(R3+R116).

Thus, as long as the condition that R2<R3<R116 is met, it is possible to correctly detect the disconnection and the normal connection of the load 2 from the output Sc of the comparator 113 by setting the reference voltage Vr of the comparator 113 to a medium value between Vb·R2/(R2+R3) and Vb·R116/(R3+R116).

For this purpose, it is a possible solution that the resistance value R3 is set to a relatively large value and the resistance value R116 is set to a still larger value. However, this solution causes the impedance of the discharge path through which the electric charges are drawn out of the gate capacitance of the power FET 111 to be large, which disadvantageously results in increases in the turn-off time of the power FET 111 (i.e., a speed-down of the load driving operation) and the switching loss of the power FET 111.

Considering the foregoing, we makes it an object of the invention to provide a load driving circuit capable of detecting abnormality such as disconnection of the load with a high accuracy and driving the load at a high speed with low power consumption.

It is another object of the invention to provide a load driver IC which enables the detection of abnormality such as disconnection of the load with a high accuracy while driving the load at a high speed with low power consumption.

SUMMARY OF THE INVENTION

According to an aspect of the invention, a circuit for controlling a feed of a power supply voltage of a power supply to a load which circuit has a function of detecting a load driving state such as disconnection and short circuit is provided. The circuit comprises: a MOSFET connected in series with the power supply and the load for effecting an on/off operation; a circuit (such as a charge pump circuit) responsive to a feed control signal given from external for supplying a driving voltage to the gate to turn the MOSFET on; a resistor connected between the power supply and the load for causing a voltage drop during an off period of the MOSFET; a detection circuit or a comparator for providing a signal indicative of the load driving state on the basis of a comparison between a predetermined reference voltage and a voltage of a node between the load and the MOSFET; protection element (such as a diode) connected between a source and a gate of the MOSFET for providing a protection against a reverse bias applied between the source and gate by by-passing; transistor circuit connected between the source and gate of the MOSFET for discharging a gate capacitance of the MOSFET; and driving circuit responsive to a non-feed indication by the feed control signal for flowing a driving current in a control electrode of the transistor circuit such that a magnitude of the driving current is enough to operate the transistor circuit and the voltage drop caused by the driving current is smaller than a difference between the power supply voltage and the predetermined reference voltage.

The transistor circuit may include a plurality (N) of transistors in such a configuration that a channel current of one of the transistors flows in a control electrode of a next transistor.

The driving circuit may comprise a resistor element for providing such a resistance as let the driving current flow, and a circuit, serially connected to the resistor element and responsive to the feed control signal, for effecting an on/off operation.

Alternatively, the driving means may comprise a current source circuit for providing the driving current; and a circuit, responsive to the non-feed indication, for enabling the current source circuit to operate.

The invention can be implemented either in a high side driver configuration or in a low side driver configuration. In the high side driver configuration, the MOSFET is connected between the power supply and the load and the MOSFET is of an N-channel type. In this case, the transistor circuit includes a PNP transistor.

In the low side driver configuration, the MOSFET is inserted in a low side of the load and the MOSFET is of a P-channel type. In this case, the transistor circuit includes an NPN transistor.

According to another aspect of the invention, an integrated circuit for use in the above-mentioned load driving circuit is provided.

BRIEF DESCRIPTION OF THE DRAWING

Further objects and advantages of the present invention will be apparent from the following description of the preferred embodiments of the invention as illustrated in the accompanying drawing, in which.

Throughout the drawing, the same elements when shown in more than one figure are designated by the same reference numerals.

DETAILED DESCRIPTION OF THE PREFERRED EMBODIMENTS

Basic Concept of the Invention

Figure 2:
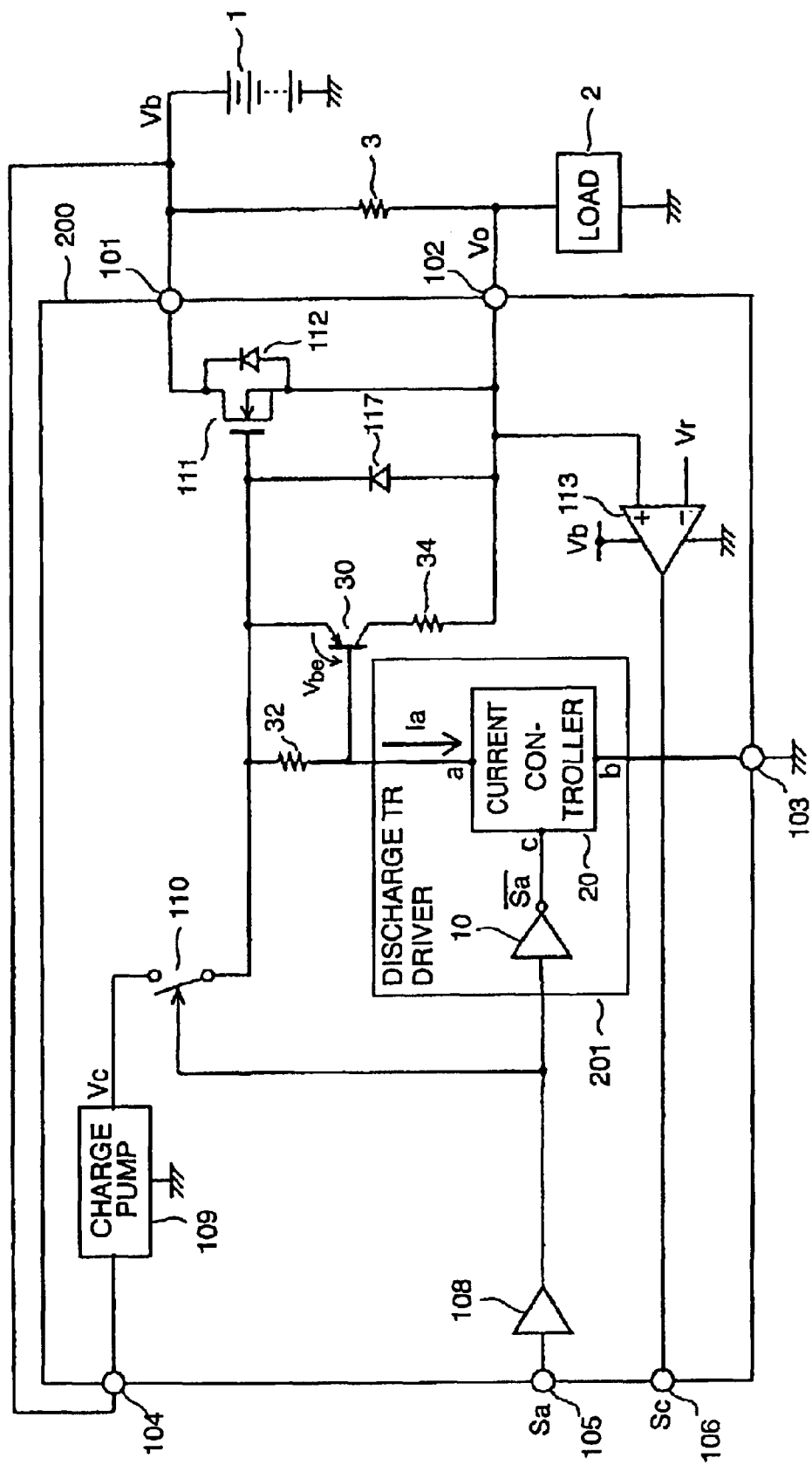
FIG. 2 is a diagram showing an exemplary arrangement of a load driving circuit in a high side driver configuration in accordance with the invention.

FIG. 2 is a diagram showing an exemplary arrangement of a load driving circuit in a high side driver configuration in accordance with the invention. The load driving circuit is used in the ECU mounted in a vehicle to drive the load 2 such as solenoids for electromagnetic valves, relay coils, lamps, light emitting diodes, etc. The load driving circuit is preferably embodied by using a load driver IC 200, which may be called "a power feed controller IC". Though in FIG. 2 the load driver IC 200 is shown as if it contains only one circuit for a single channel or load, the load driver IC actually contains a lot of circuits. It is noted that the element shown as battery 1 may be either an actual battery or any suitable circuit capable of supplying a constant voltage.

Figure 1:
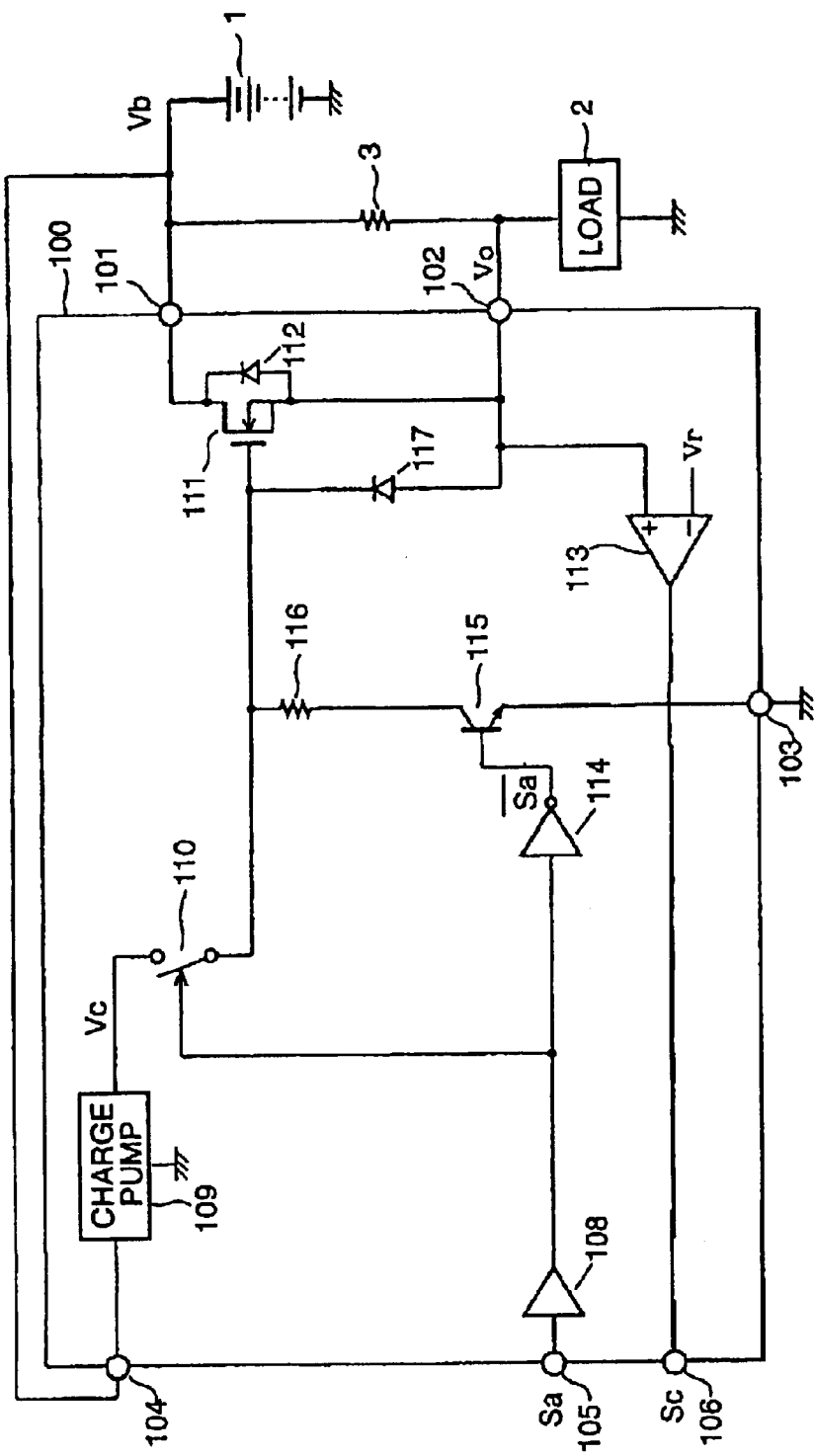
FIG. 1 is a diagram for conceptually describing the structure of a conventional load driving circuit with a load disconnection and/or short circuit detection function.

The load driving circuit of FIG. 2 is identical to that of FIG. 1 except that, in FIG. 2, the load driver IC 100 has been replaced with the load driver IC 200. The load driver IC 200 is identical to the load driver IC 100 except that, in the load driver IC 200:

the resistor 116 has been replaced with a resistor 32;

the transistor 115 has been replaced with a current controller 20;

a PNP transistor 30 has been added with its base connected to the node between resistor 32 and current controller 20 and its emitter connected to the node including the gate of the FET 111; and a resistor 34 has been connected between the collector of PNP transistor 30 and the node including the power output pin 102.

According to the principles of the invention, the current controller 20 is so designed as to cause the current Ia flowing from terminal 20*a* to terminal 20*b* thereof to be zero if the control terminal 20*c* of the current controller 20 is supplied with logical "0" (this means that the power feed control signal Sa indicates logical "1" in this specific example) and to have a predetermined magnitude Ion if the control terminal 20*c* of the current controller 20 is supplied with logical "1" (this means that the power feed control signal Sa indicates logical "0" in this specific example).

Since the resistor 32 is provided in order to prevent the transistor 30 from operating erroneously, the resistor 32 may be used if required.

Having described the structure of the load driving circuit, its operation will be described in the following.

(1) In Case of the Control Signal Sa Indicating Logical "1"

In this operating state, the load driving circuit can be said to be in the "feeding mode". In this case, the control input 20c of the current controller 20 is supplied with a signal $\overline{Sa}$ of logical "0", causing the current controller 20 to pass no current as just described, which results in the PNP transistor 30 being off. On the other hand, the power feed control signal Sa of logical "1" makes the switch 110 on. As a result, the charge pump 109 output Vc being supplied to the FET 111 gate causes the FET 111 to operate in the on state in a linear region. Accordingly, if the power FET 111 or the load 2 has no abnormality such as disconnection, short circuit, etc., then the IC 200 output level Vo is close to the battery voltage Vb: i.e., the load 2 is substantially in a power-fed state. Then, the comparator 113 outputs a comparison signal Sc of a high level. The above-mentioned not-shown external controller can recognize, on the basis of the power feed control signal Sa (of the high level) output by itself and the comparison signal Sc (of a high level) from the load driver IC 200, that the load 2 is in a normally driven state.

On the contrary, if the load 2 is short-circuited, then the IC 200 output level Vo is lower than the reference voltage Vr, causing the comparator 113 to output a low level comparison signal Sc. From this low level comparison signal Sc, the not-shown controller can recognize that the load 2 is abnormal in the driven state.

(2) In Case of the Control Signal Sa Indicating Logical "0"

In this operating state, the load driving circuit can be said to be in the "non-feeding mode". As described above, the control signal Sa of logical "0", which indicates that the battery voltage Vb should not be supplied to the load 2, causes the switch 110 to be off. Further, the inverted version of the control signal Sa, i.e., logical "1" is applied to the control input terminal 20a of the current controller 20, causing the current controller 20 to pass the current Ia from terminal 20a to terminal 20a thereof. The current Ia, which flows through the base of the PNP transistor 30, keeps the PNP transistor 30 in an on state in which the transistor 30 can pass the collector current $h_{FE}$ times the magnitude Ion of the current controller 20 current Ia in the non-feeding mode. The collector current of the transistor 30 rapidly discharges the electric charges accumulated in the gate capacitance of the power FET 111 through a low impedance discharging path comprising the transistor 30 and the resistor 34, which turns the power FET 111 off in a short time, resulting in the load 2 being in a power-off state.

The discharge period is substantially determined on the basis of the current controller 20 current value Ion and the resistance value R34. The larger the current value Ion is and/or the smaller the resistance value R34 is, the shorter the discharge period becomes. The resistance value R34 may be set to 0Ω. Also, the current Ia value Ion for the non-feeding mode may be set to a magnitude 1/$h_{FE}$ times the collector current of the PNP transistor 30 as seen from the above description. The lower limit value of the current controller 20 current value Ion which is necessary for driving the discharging PNP transistor 30 is given by $$Ion > Vbe/R32, \quad (1)$$

where Vbe is the voltage between base and emitter of the PNP transistor 30 and R32 is a resistance value of the resistor 32.

If the power FET 111 is off and if the load 2 or the power FET 111 is free from any abnormality such as disconnection or short circuit, the condition under which the comparator 113 outputs a comparison signal Sc of the low level indicative of a non-disconnection state is given by the expression:

$$Vb \cdot R2/(R3+R2) < Vr. \quad (2)$$

However, if the load 2 is disconnected, then the current Ia flows either through a path consisting of battery 1, resistor 3, output pin 102, diode 117, PNP transistor 30 emitter and base, and current controller 20 or through a path consisting of battery 1, resistor 3, output pin 102, resistor 34, PNP transistor 30 collector and base, and current controller 20. Since this current Ia causes a voltage drop across the resistor 3, the IC output level Vo lowers to Vb—Ion·R3. Thus, the condition under which the comparator 113 outputs a comparison signal Sc of the high level indicative of a disconnection state is given by the expression:

$$Ion \cdot R3 < (Vb-Vr) \quad (3)$$

Accordingly, in order to surely detect the disconnection, if any, of the load 2 in case of the power feed control signal Sa indicating logical "0", it is suffice to determine the resistance value R3 of the resistor 3 according to expression (2) and then determine the value Ion of the current controller 20 current Ia according to expressions (1) and (3).

According to the present invention, the current controller 20 current necessary for turning off the power FET 111 (i.e., discharging the gate capacitance of the power FET 111) flows in the base of the discharge transistor 30 which constitutes a discharge path between gate and source of the power FET 111. This makes it possible to flow a collector current enough for rapidly turning the power FET 111 off in the discharge PNP transistor 30 even if the current controller 20 current value Ion is so set as to satisfy the expression (3). That is, the turn-off time of the power FET 111 is shortened, which in turn reduces the switching loss.

In other words, the current controller 20 current value Ion for the non-feeding mode can be set to a smaller value. This reduces the voltage drop across the resistor 3 in case of disconnection of the load 2, which increases the power output Vo margin for the reference voltage Vr, enabling more accurate detection of abnormalities. Further, since the current Ia value Ion necessary for turning the power FET 111 off is set smaller, this reduces the power consumption of the load driving circuit or the load driver IC 200.

Resistor-Based Current Controller

Figure 3A:
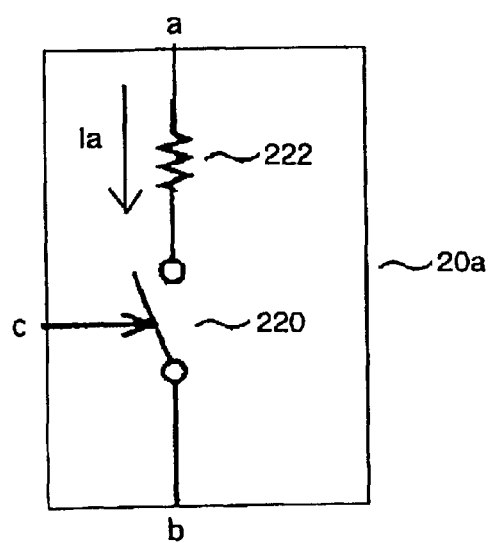
FIG. 3A is a diagram showing an exemplary conceptual structure of a current controller which is implemented by using a resistor element in accordance with an aspect of the invention.

The current controller 20 may be implemented by using a resistor. FIG. 3A is a diagram showing an exemplary conceptual structure of a resistor-based current controller according to an aspect of the invention. In FIG. 3A, the current controller 20a comprises a resistor 222 of which one end serves as a first conductor terminal "a" thereof; and an on/off-based switch circuit 220 connected between the other end of resistor 222 and a second conductor terminal "b" of the current controller 20a and having its control terminal connected to the control terminal "c" of the current controller 20a. It is noted that the resistor 222 may be a single resistor or any suitable circuit having an equivalent resistance equal to the resistance value R222.

In the non-feeding mode of a load driving circuit which uses the current controller 20a, the condition under which the discharge PNP transistor 30 is turned on (i.e., the power FET 111 is turned off) is given by the expression:

$$(Vb-Vbe-Vf) \cdot R32/(R3+R222) > Vbe, \quad (4)$$

where Vf is the forward voltage across the diode 117.

The condition under which the comparator 113 outputs a comparison signal Sc of the low level indicative of a non-disconnection state in case of no abnormality such as disconnection or short circuit of the power FET 111 or the load 2 is given by the above expression (2). Also, the condition under which the comparator 113 outputs a comparison signal Sc of the high level indicative of a disconnection state is given by the expression:

$$(Vb-Vbe-Vf) \cdot R3/(R3+R222) > Vb-Vr. \qquad (5)$$

Accordingly, the disconnection of the load 2 can be surely detected in the non-feeding mode by determining the resistance value R3 of the resistor 3 according to expression (2) and then determining the resistance value R222 of the resistor or resistance circuit 222 according to expressions (4) and (5).

Constant Current Source-Based Current Controller

Figure 3B:
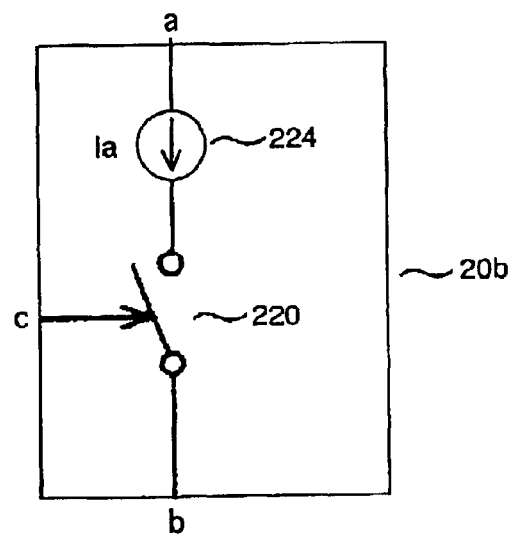
FIG. 3B is an equivalent circuit diagram of a current controller which is implemented by using a constant current source in accordance with another aspect of the invention.

The current controller 20 may be implemented by using a constant current source. FIG. 3B is an equivalent circuit diagram of a current controller which is implemented by using a constant current source in accordance with another aspect of the invention. The current controller 20b is identical to the current controller 20a except that in FIG. 3B the resistor element 222 has been replaced with a constant current source 224. It should be noted that though in FIG. 3B the constant current source 224 and the switch circuit 220 are shown as implemented separately in order to facilitate the understanding of the invention, the current controller 20b may be implemented such that the current source 224 incorporates the switching function of switch 220.

A load driving circuit which uses the current controller 20b of FIG. 3B operates in the same way as in case of the load driving circuit 200 of FIG. 2 and accordingly has the same advantages as the load driving circuit 200.

Preferred Embodiment

Figure 4:
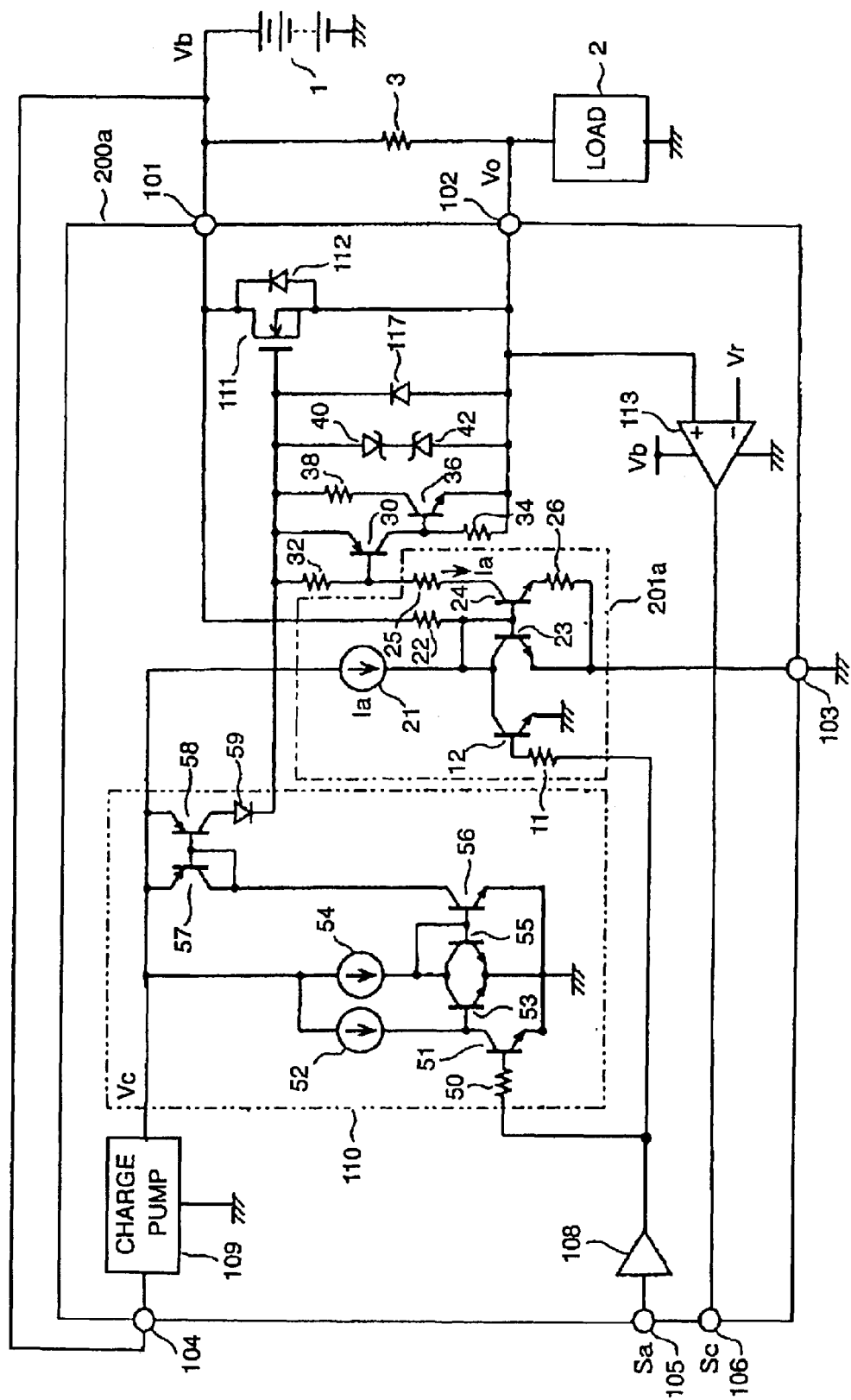
FIG. 4 is a diagram for illustrating an exemplary arrangement of a load driver IC that uses a current controller of the type of FIG. 3B in accordance with a preferred embodiment of the invention.

FIG. 4 is a diagram for illustrating an exemplary arrangement of a load driver IC that uses a current controller of the type of FIG. 3B in accordance with a preferred embodiment of the invention. The differences between the load driver IC's 200a and 200 are that, in FIG. 4:

the switch circuit 110 has been shown in detail;

the discharge transistor driver 201 has been replaced with a detailed version 201a thereof;

between gate and source of the power FET 111, there has been inserted an additional discharge path comprising a resistor 38 and an NPN transistor 36; and between gate and source of the power FET 111, there has been also inserted a pair of serially anode-coupled Zener diodes 40 and 42.

One end of resistor 38 is connected to the FET 111 gate and the other end of resistor 38 is connected to the transistor 36 collector. The NPN transistor 36 has its emitter connected to the FET 111 source and its base connected to the node between the resistor 34 and the collector of the PNP transistor 30. Thus arranging the transistors 30 and 36 enables the transistor 36 to pass the collector current $h_{FE}^2$ times the magnitude Ion of the current controller 201a current Ia. This enables a further speed-up of turning-off operation of the power FET 111, and further reductions in the switching loss and the power consumption of the load driving circuit or the load driver IC 200a. However, the NPN transistor 36 and the resistor 38 may be omitted.

Adding the Zener diodes 40 and 42 advantageously enables the gate of the power FET 111 to be protected more securely against negative and positive excess voltages. However, the Zener diodes 40 and 42 may be omitted.

Excepting what has been described so far, the load driver IC's 200a and 200 are the same. Accordingly, the descriptions concerning the load driver IC 200 are also true to the load driver IC 200a. For example, the resistance value R3 of the pull-up resistor 3 and the value Ion of the current controller current (or the discharge transistor 30 driving current in the non-feeding mode) Ia can be determined according to the expressions (1) through (3).

The discharge transistor driver 201a and the switch circuit 110 will be detailed in the following.

In the discharge transistor driver 201a, a resistor 11 and an NPN transistor 12 constitute the switch circuit 10. The resistor 11 is connected between the buffer 108 output and the gate of the transistor 12, the emitter of which is connected to the ground pin 103. NPN transistors 23 and 24 and a resistor 26 constitute a current mirror. The NPN transistor 23 has its emitter connected to the ground pin 103 and its collector connected to its base, the collector of the transistor 12 and the cathode of a constant current source 21, the anode of which is connected to the charge pump 109 output Vc. The NPN transistor 24 has its emitter connected to the ground pin 103 through a resistor 26 and has its collector connected to the base of the PNP transistor 30 through a resistor 25. It is noted that the commonly coupled bases of the current mirror (23+24) are connected to the battery voltage pin 101 through a resistor 22. This is for the purpose of preventing the gate potential of the power FET 111 from being unsettled in case when the battery voltage Vb is supplied only to the power supply pin 101 while the power supply pin 104 being kept open.

If the power feed control signal Sa is high (in the feeding mode), the switch transistor 12 is conductive with its collector and the collector of the transistor 23 pulled down to the low level, which turns the current mirror transistors 23 and 24 off, causing the discharge transistor 30 driving current Ia to be zero. On the contrary, a low-level power feed control signal Sa turns the switch transistor 12 off, making its collector high impedance, which permits the normal operation of the current mirror (23+24), causing the collector current Ia (=Ion) of the transistor 23 caused by the constant current source 21 to be reflected to flow in the collector of the transistor 24.

In the switch circuit 110, a pair of NPN transistors 55 and 56 and a pair of PNP transistors 57 and 58 constitute respective current mirrors. A cathode of a constant current source 54 for providing a constant current Ia is connected to the collector of the NPN transistor 55. The constant current Ia is reflected by the current mirrors and eventually supplied from the PNP transistor 58 through a diode 59 to the gate of the power FET 111. In parallel with the NPN transistor 55, there is connected an NPN transistor 53, which has its base connected to a cathode of a constant current source 52 and a collector of another NPN transistor 51. The base of the transistor 51 is connected to the buffer 108 output through a resistor 50. The emitters of the transistors 51, 53, 55 and 56 are connected to the ground pin 103. The above-mentioned constant current sources 52 and 54 are so arranged as to operate by using the output voltage Vc of the charge pump 109 as a power supply.

In operation, if the power feed control signal Sa is high (in the feeding mode), the transistor 51 is conductive with its collector and the base of the transistor 53 pulled down to the low level, make the transistor 53 off, which enables the following circuit to operate. Thus, the output of the charge pump 109 is supplied to the gate of the power FET 1111. On the contrary, a low-level power feed control signal Sa turns the transistor 51 off, making its collector high impedance, which causes the current from the constant current source 52 to flow in the transistor 53 base to make the transistor 53 on with its collector pulled down, which disables the following circuit to operate. Thus, the output of the charge pump 109 is not supplied to the gate of the power FET 1111. In this way, the switch circuit 110 controls the supply of the raised voltage Vc in response to the power feed control signal Sa.

Load Driving Circuit in a Low Side Driver Configuration

Figure 5:
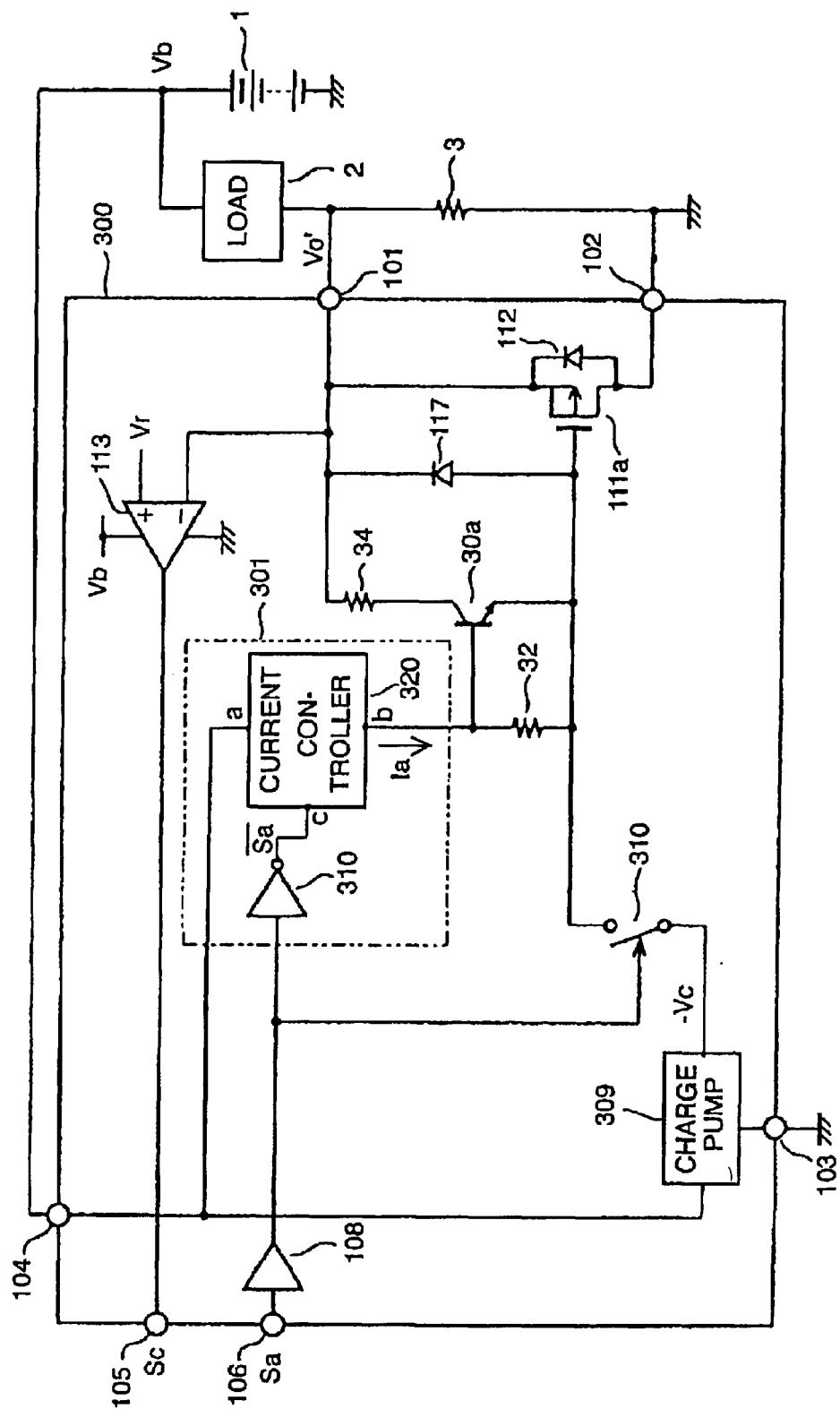
FIG. 5 is a diagram showing an exemplary arrangement of a load driving circuit in a low side driver configuration in accordance with the invention.

FIG. 5 is a diagram showing an exemplary arrangement of a load driving circuit 300 in a low side driver configuration in accordance with the invention. In FIG. 5, a P-channel MOSFET 111a is used as a low side driver for the load 2, and the connections to the power supplies are reversed as compared with the load driving circuit 200 of FIG. 2.

The load 2 is connected between the positive electrode of the battery 1 and the IC power pin 101. The discharge PNP transistor 30 has been replaced with a discharge NPN transistor 30a. The discharge transistor driver 201, the switch 10 and the current controller 20 have been replaced with corresponding polarity-adjusted elements 301, 310 and 320.

The charge pump circuit has been changed from 109 to 309. The charge pump circuit 309 is so arranged as to use the battery voltage Vb supplied through the IC pin 104 and generate a raised voltage—Vc lower than the battery voltage Vb by more than the threshold voltage Vt (<0) of the power FET 111a.

Since the construction of the load driving circuit 300 is fundamentally the same as that of the circuit 200, the load driving circuit 300 operates in the same way and provides the same advantages as the load driving circuit 200.

The foregoing merely illustrates the principles of the invention. Thus, various modifications are possible.

For example, instead of the PNP 30 and NPN 36 bipolar transistors, P-channel and N-channel MOSFET may be used.

If the Zener diode pair (40, 42) is so arranged as to also effect the protection function by the diode 117, then the diode 117 may be omitted.

The above-described various features of the invention may be combined in any suitable manner.

Many widely different embodiments of the present invention may be constructed without departing from the spirit and scope of the present invention. It should be understood that the present invention is not limited to the specific embodiments described in the specification, except as defined in the appended claims.

What is claimed is:

1. A circuit for controlling a feed of a power supply voltage of a power supply to a load wherein the circuit has a function of detecting a load driving state, the circuit comprising:

a MOSFET connected in series with said power supply and an output terminal connected to the load for effecting an on/off operation;

means responsive to a feed control signal given from an external circuit for supplying a driving voltage to said gate to turn said MOSFET on;

a resistor connected between said power supply and said output terminal in parallel to said MOSFET, said resistor, if said load is abnormal during off period of the MOSFET, setting a voltage of the output terminal to a predetermined voltage;

detection means connected to the output terminal for providing a signal indicative of said load driving state on the basis of a comparison between a predetermined reference voltage and the voltage of the output terminal;

protection means connected between a source and a gate of said MOSFET for providing a protection against a reverse bias applied between said source and gate by bypassing;

transistor means connected between said source and gate of said MOSFET for discharging a gate capacitance of said MOSFET; and driving means responsive to a non-feed indication by said feed control signal for causing a driving current to flow in a control electrode of said transistor means such that a magnitude of said driving current is enough to operate said transistor means, and a voltage drop in said resistor caused by a flow of said driving current therein is smaller than a difference between said power supply voltage and said predetermined reference voltage.

2. A circuit as defined in claim 1, wherein said transistor means includes a plurality of transistors in such a configuration that a channel current of one of said transistors flows in a control electrode of a next transistor.

3. A circuit as defined in claim 1, wherein said driving means comprises:

resistor means for providing such a resistance as let said driving current flow; and means, serially connected to said resistor means and responsive to said feed control signal, for effecting an on/off operation.

4. A circuit as defined in claim 1, wherein said driving means comprises:

current source means for providing said driving current; and means, responsive to said non-feed indication, for enabling said current source means to operate.

5. A circuit as defined in claim 1, wherein said MOSFET is connected between said power supply and said load and said MOSFET is of an N-channel type and wherein said transistor means includes a PNP transistor.

6. A circuit as defined in claim 1, wherein said MOSFET is inserted in a low side of said load and said MOSFET is of a P-channel type and wherein said transistor means includes an NPN transistor.

7. An integrated circuit for use in a load driving circuit for controlling a feed of a power supply voltage of a power supply to a load wherein the load driving circuit has a function of detecting a load driving state, the integrated circuit comprising:

upstream and downstream pins to which said power supply and said load are to be connected such that a power supply current by said power supply flows from said upstream pin to said downstream pin;

a MOSFET to be connected in series with said power supply and said load for effecting an on/off operation;

means responsive to a feed control signal given from an external circuit for supplying a driving voltage to said gate to turn said MOSFET on, said upstream and downstream pins for enabling said serial connection of said MOSFET, said power supply and said load wherein an external resistor is connected between said upstream and downstream pins to set, if said load is abnormal during off period of a MOSFET, a voltage of one of the upstream and downstream pins which is connected between the load and the external resistor to a predetermined voltage;

detection means connected to one of the upstream and downstream pins for providing a signal indicative of said load driving state on the basis of a comparison between a predetermined reference voltage and the voltage of one of the upstream and downstream pins;

protection means connected between a source and a gate of said MOSFET for providing a protection against a reverse bias applied between said source and gate by bypassing;

transistor means connected between said source and gate of said MOSFET for discharging a gate capacitance of said MOSFET; and means responsive to a non-feed indication by said feed control signal for causing a current to flow in a control electrode of said transistor means such that a magnitude of said current is enough to operate said transistor means, and a voltage drop in said external resistor caused by a flow of said driving current therein is smaller than a difference between said power supply voltage and said predetermined reference voltage.

* * * * *